(12) United States Patent
Ha et al.

(10) Patent No.: US 11,599,145 B2
(45) Date of Patent: Mar. 7, 2023

(54) ELECTRONIC DEVICES WITH CURVED DISPLAYS

(71) Applicant: Apple Inc., Cupertino, CA (US)

(72) Inventors: Mingjing Ha, Cupertino, CA (US); Kuan H. Lu, Santa Clara, CA (US); Paul S. Drzaic, Morgan Hill, CA (US); Yung-Yu Hsu, San Jose, CA (US); Yong Sun, Sunnyvale, CA (US); Zhen Zhang, Sunnyvale, CA (US); Bulong Wu, San Jose, CA (US); Marc J. DeVincentis, Palo Alto, CA (US); Paolo Sacchetto, Cupertino, CA (US); Han-Chieh Chang, Sunnyvale, CA (US); Anshi Liang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/178,556

(22) Filed: Feb. 18, 2021

(65) Prior Publication Data
US 2021/0318715 A1    Oct. 14, 2021

Related U.S. Application Data

(60) Provisional application No. 63/007,845, filed on Apr. 9, 2020.

(51) Int. Cl.
*G06F 1/16*    (2006.01)
(52) U.S. Cl.
CPC ............ *G06F 1/163* (2013.01); *G06F 1/1652* (2013.01)

(58) Field of Classification Search
CPC ...... G06F 1/163; G06F 1/1652; G06F 1/1633; G06F 1/1643; G06F 1/1656; H01L 27/326; H01L 27/3237
See application file for complete search history.

(56) References Cited

U.S. PATENT DOCUMENTS

| | | | | |
|---|---|---|---|---|
| 9,640,516 B2 * | 5/2017 | Cope | ................... | H01L 25/0655 |
| 10,152,914 B2 * | 12/2018 | Meersman | ........... | H05K 5/0247 |
| 10,824,190 B1 | 11/2020 | Hsu et al. | | |
| 10,964,234 B2 * | 3/2021 | Kim | ...................... | G06F 1/1652 |
| 11,151,909 B1 * | 10/2021 | Yang | ..................... | G06F 1/1652 |
| 11,158,824 B2 * | 10/2021 | Zhu | ..................... | H01L 27/3276 |
| 2017/0040306 A1 * | 2/2017 | Kim | ....................... | H05K 1/181 |

(Continued)

FOREIGN PATENT DOCUMENTS

WO    2020057063 A1    3/2020

*Primary Examiner* — Rockshana D Chowdhury
(74) *Attorney, Agent, or Firm* — Treyz Law Group, P.C.; G. Victor Treyz; Tianyi He

(57) ABSTRACT

An electronic device display may have pixels formed from crystalline semiconductor light-emitting diode dies, organic light-emitting diodes, or other pixel structures. The pixels may be formed in a display panel having a single substrate or an array of display panel tiles. The display panel has inwardly facing display panel contacts that mate with corresponding outwardly facing interconnect substrate contacts on an interconnect substrate. The interconnect substrate may have areas with compound curvature that are overlapped by the display panel. To enhance flexibility of the interconnect substrate, the interconnect substrate may have flexibility enhancement openings and/or may be formed from a material with a low elastic modulus such as silicone or other elastomeric material.

21 Claims, 13 Drawing Sheets

(56) References Cited

U.S. PATENT DOCUMENTS

2020/0051964 A1\* 2/2020 Jung .................... H01L 25/167
2020/0337160 A1 10/2020 Hsiao
2021/0018964 A1\* 1/2021 Oh .................... G02F 1/136286

\* cited by examiner

ELECTRONIC DEVICES WITH CURVED DISPLAYS

This application claims the benefit of provisional patent application No. 63/007,845, filed Apr. 9, 2020, which is hereby incorporated by reference herein in its entirety.

FIELD

This relates generally to electronic devices, and, more particularly, to electronic devices with displays.

BACKGROUND

Electronic devices often have displays. A display may have an active area with pixels for displaying an image for a user and an inactive border. A display may have planar surfaces and surfaces with curvature.

It can be challenging to form displays for electronic devices. If care is not taken, display performance may be adversely affected when forming displays with surface curvature. There may also a risk that the inactive border areas of a display might be overly large and unsightly.

SUMMARY

An electronic device display may have a display panel mounted to a separate interconnect substrate. The interconnect substrate may include interconnects that help route signals to the display panel without requiring formation of an undesirably large inactive display border containing signal routing lines. The display panel may be formed from a single substrate layer or may include a set of display panel tiles that cover the interconnect substrate. The interconnect substrate may be flexible and may be characterized by curved surfaces such as surface areas exhibiting compound curvature. This allows the display to have curved surface areas.

Interconnect substrates may have outwardly facing contacts that are electrically shorted to corresponding inwardly facing display panel contacts. The interconnect substrates may have interconnects that help route signals for the display panels. If desired, integrated circuits may be mounted to inwardly facing interconnect substrate contacts, may be embedded in the interconnect substrates, and/or may be embedded in the display panel.

The interconnect substrate may be sufficiently flexible to allow the surfaces of the interconnect substrate to exhibit compound curvature when mounted on a support structure of compound curvature and/or when mounted against the inner surface of a display cover layer having compound curvature. To enhance the flexibility of the interconnect substrate and thereby help avoid wrinkling and/or buckling of the interconnect substrate, the interconnect substrate may have flexibility enhancement openings and/or may be formed from a material with a low elastic modulus such as silicone or other elastomeric material.

DETAILED DESCRIPTION

Electronic devices may be provided with displays. Displays may be used for displaying images for users. Displays may be formed from arrays of light-emitting diode pixels or other pixels. For example, a device may have an organic light-emitting diode display or a display formed from an array of micro-light-emitting diodes (e.g., diodes formed from crystalline semiconductor dies).

Figure 1:
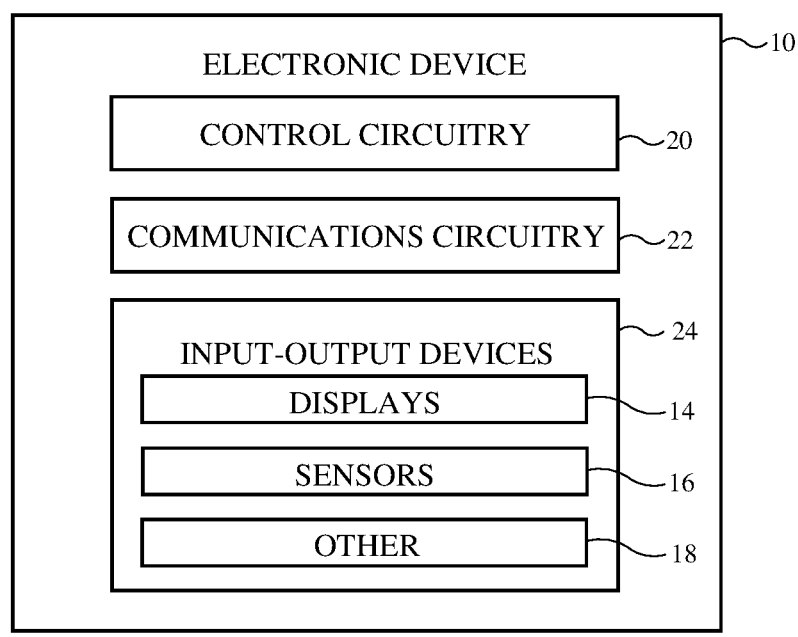
FIG. 1 is a schematic diagram of an illustrative electronic device in accordance with an embodiment.

A schematic diagram of an illustrative electronic device having a display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a wristwatch, cellular telephone, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display or microLED display are sometimes described herein as an example.

Display 14 may have an array of pixels configured to display images for a user. The pixels may be formed on display panels formed from rigid and/or flexible display panel substrates. One or more additional substrates, which may sometimes be referred to as interconnect substrates, may include interconnects (signal paths) for distributing power and other signals to the display panel(s). In an illustrative configuration, one or more display panels may be mounted to a flexible interconnect substrate so that display panel contacts mate with corresponding interconnect substrate contacts, thereby electrically connecting the interconnects of the display panel(s) to the interconnects of the interconnect substrate. The flexibility of the interconnect substrate allows the interconnect substrate to conform to curved display surfaces.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
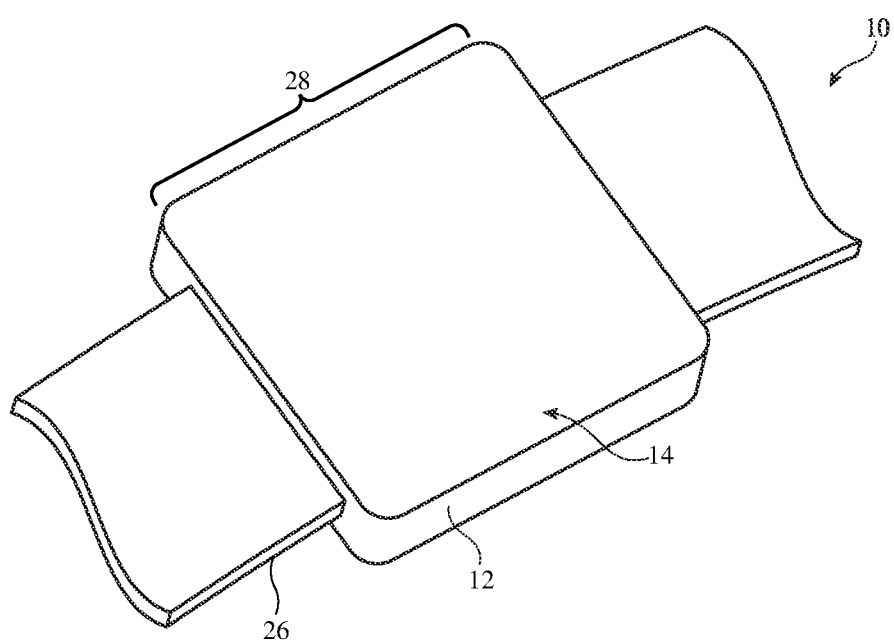
FIG. 2 is a perspective view of an illustrative electronic device with a display in accordance with an embodiment.

FIG. 2 is a perspective view of electronic device 10 in an illustrative configuration in which device 10 is a wearable electronic device such as a wristwatch. As shown in FIG. 2, device 10 may have a band such as band 26 and a main unit such as main unit 28 that is coupled to band 26. Display 14 may cover some or all of the front face of main unit 28. Touch sensor circuitry such as two-dimensional capacitive touch sensor circuitry may be incorporated into display 14. Band 26, which may sometimes be referred to as a strap, wrist strap, watch strap, wrist band, or watch band, may be used to secure main unit 28 to the wrist of a user.

Main unit 28 may have a housing such as housing 12. Housing 12 may form front and rear housing walls, sidewall structures, and/or internal supporting structures (e.g., a frame, midplate member, etc.) for main unit 28. Glass structures, transparent polymer structures, image transport layer structures (e.g., coherent fiber bundles forming fiber optic plates that can serve as display cover layers and/or parts of display cover layers), and/or other transparent structures that cover display 14 and other portions of device 10 may provide structural support for device 10 and may sometimes be referred to as housing structures or display cover layer structures. For example, a transparent housing portion such as a glass or polymer housing structure that covers and protects a pixel array in display 14 may serve as a display cover layer for the pixel array while also serving as a housing wall on the front face of device 10. The portions of housing 12 on the sidewall and rear wall of device 10 may be formed from transparent structures and/or opaque structures.

Device 10 of FIG. 2 has a rectangular outline (rectangular periphery) with four rounded corners (e.g., the front face of device 10 may be square). If desired, device 10 may have other shapes (e.g., a circular shape, a rectangular shape with edges of unequal lengths, and/or other shapes). The configuration of FIG. 2 is illustrative.

If desired, openings may be formed in the surfaces of device 10. For example, openings may be formed to accommodate speakers, cable connectors, microphones, buttons, and/or other components. Openings such as connector openings may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

It may be desirable to minimize the borders of display 14. This may be accomplished by attaching a pixel array to one or more underlying interconnect substrates using vias and/or by bending a flexible display panel substrate out of the plane of the pixel array.

Figure 3:
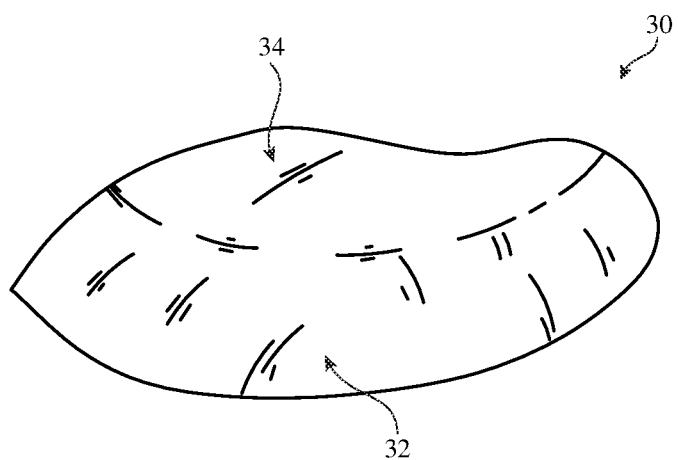
FIG. 3 is a cross-sectional side view of an illustrative layer for a display showing how the layer may have surface curvature in accordance with an embodiment.

Device 10 may have planar surfaces and/or surfaces with curved cross-sectional profiles. For example, display 14 may include one or more layers that include planar and/or curved portions. These display layers may include cover layers, display panel layers containing pixels, interconnect substrate layers, adhesive layers, touch sensor layers, etc. An illustrative display layer is shown in FIG. 3. As shown in the perspective view of FIG. 3, display layer(s) in display 14 such as illustrative display layer 30 may have planar surfaces such as planar surface 34 and curved surfaces such as curved surface 32. Curved surfaces have curved cross-sectional profiles.

Display layers may be characterized by curved surfaces that can be flattened into a plane without distortion (sometimes referred to as developable surfaces). For example, the centers of the straight edges of a display layer having a rectangular outline and rounded corners may be characterized by developable surfaces. Display layers may also have surface regions of compound curvature (e.g., a surface that can only be flattened into a plane with distortion, sometimes referred to as a surface with Gaussian curvature). As an example, rounded surface areas in the rounded corners of a rectangular display with straight edges and rounded corners may have compound curvature (see, e.g., surface 32 of FIG. 3). As another example, a circular display layer may have a circular central area that is planar and this central area may be surrounded by a circular ring-shaped region with compound curvature (e.g., edge portions of the circular display layer may slope downwardly from the planar central area).

Challenges arise in forming display layers for displays with curved surfaces such as areas of compound curvature. If care is not taken, display layers will exhibit undesired levels of stress or will wrinkle.

To avoid these issues, display 14 can be provided with substrate layers that are thin, that have recesses and/or through-hole openings to facilitate bending, and/or that are formed from elastomeric materials such as silicone or other polymers with a relatively low elastic modulus. To ensure that there is a desired density of pixels visible on the front of display 14, different approaches may be taken in forming different display layers. As one example, a first display layer at the top of the display such as the display panel substrate on which the pixels of the display are formed may be formed from a first type of structure (e.g., rigid tiles), whereas a second display layer at the bottom of the display such as the interconnect substrate on which the display panel tiles are mounted, may be formed from an elastomeric mesh. The display panel tiles may have any suitable lateral dimensions X1 and Y1 (e.g., X1 and/or Y1 may have values of at least 10 microns, at least 20 microns, 10-60 microns, at least 100 microns, less than 1000 microns, less than 500 microns, less than 200 microns, less than 100 microns, etc.). Each tile may include an array of pixels. Other configurations in which the upper and lower substrates in display 14 are formed using different types of structures may be used, if desired.

Figure 4:
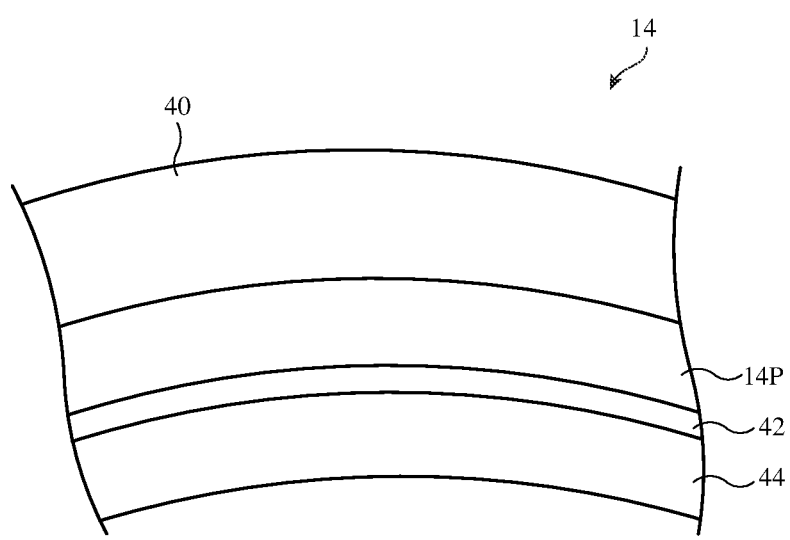
FIG. 4 is a cross-sectional side view of an illustrative display in accordance with an embodiment.

FIG. 4 is a cross-sectional side view of a portion of an illustrative display having display layers with curved cross-sectional profiles (e.g., a display having an area of compound curvature and/or other curved surface areas). In the example of FIG. 4, display 14 includes display panel 14P on an inwardly facing surface of display cover layer 40, optional adhesive layer 42, and interconnect substrate 44. Display cover layer 40 (e.g., a layer of clear polymer, glass, sapphire, etc.) may overlap panel 14P, adhesive layer 42, and substrate 44. The outer and inner surfaces of layer 40 may have areas of compound curvature (as an example).

To relieve shear stresses that might otherwise tend to build up as the layers of display 14 are bent to form curved surfaces, adhesive layer 42 may, if desired, be formed from an elastic polymer that is able to deform (e.g., shear) while portions of the opposing surfaces of layers 14P and 44 slip past each other. Stress may also be reduced by forming substrate 44 from silicone or other elastomeric material that has a low elastic modulus (e.g., an elasticity of less than 10 GPa, less than 2 GPa, less than 0.4 GPa, less than 0.1 GPa, less than 0.01, at least 0.001, etc.). Substrate 44 may include recesses and/or through-holes that help enhance flexibility.

Panel 14P may likewise be formed from an elastomeric structure and/or a structure with recesses or other openings or may, if desired, be formed using tiled rigid substrates (e.g., tiles formed from a substrate material having an elastic modulus of 0.1-10 GPa, at least 1 GPa, at least 10 GPa, at least 100 GPa, etc.). With this approach, interconnect substrate 44 can be provided with large openings or other potentially unsightly structures to facilitate bending without making those structures visible to the user of device 10 (because the pixels of overlapping display panel tiles in panel 14P cover these potentially unsightly structures and block them from view). The materials used in forming panel 14P, adhesive layer 42, and substrate 44 may, if desired, differ from one another. For example, panel 14P may be formed from a substrate material such as polyimide or fiber-glass-filled epoxy, substrate 44 may be formed from a soft elastomeric material such as silicone, and adhesive layer 42 may be formed from one of these materials (e.g., silicone to accommodate shearing) or a different material (e.g., acrylic).

Figure 5:
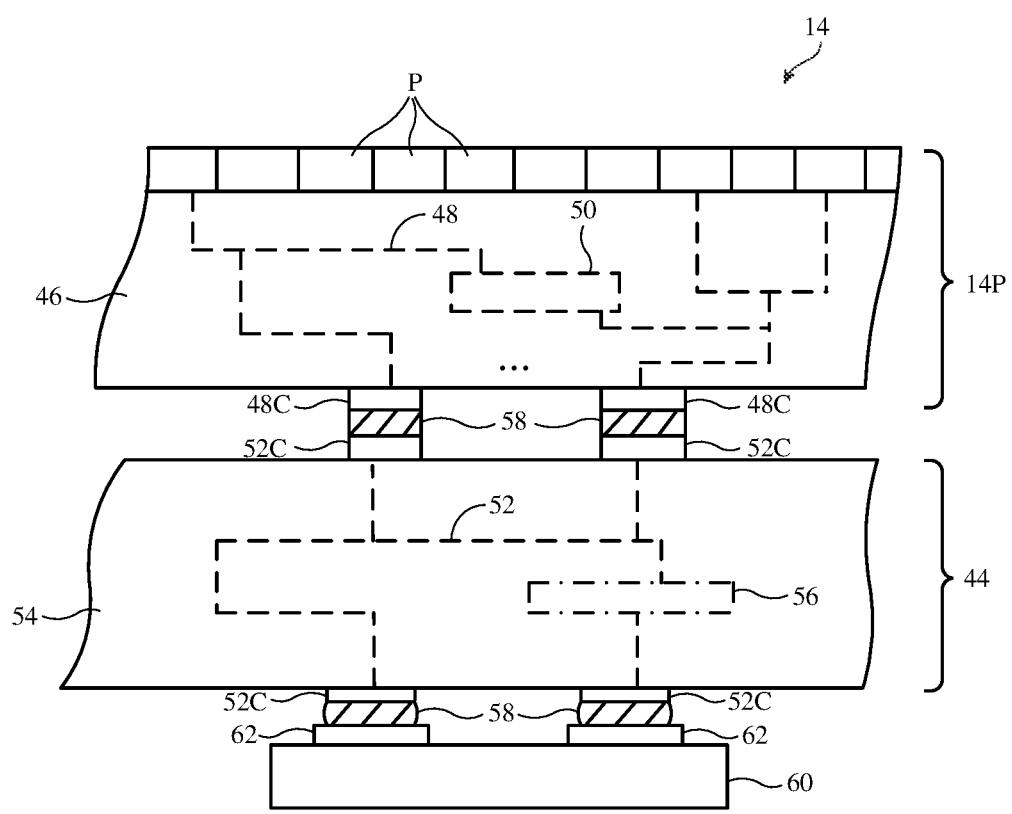
FIG. 5 is a cross-sectional side view of an illustrative portion of a display in which a display panel layer is mounted to an interconnect substrate in accordance with an embodiment.

A cross-sectional side view of a display with stacked display layers such as these is shown in FIG. 5. As shown in FIG. 5, display 14 may include display panel 14P and interconnect substrate 44. Display panel 14P may be formed on an outwardly facing surface of substrate 44 (e.g., a surface facing away from the interior of housing 12). Display panel 14P may have an array of pixels P. Pixels P may be thin-film organic light-emitting diodes, light-emitting diodes formed from crystalline semiconductor dies, and/or other pixels. Panel 14P may be a single unbroken layer or may be divided into individual smaller panels (display panel tiles). When divided into display panel tiles, each tile may contain an N×N array of pixels P. The value of M may be at least 1, at least 5, at least 10, at least 16, at least 32, at least 100, less than 250, less than 75, less than 25, or less than 17 (as examples). Display panel 14P may have a substrate such as substrate 46 that is formed from one or more dielectric layers. The layer(s) forming substrate 46 may be flexible printed circuit layers such as polyimide layers, layers of rigid printed circuit board material such as fiberglass-filled epoxy (e.g., FR4), and/or other layers of polymer (or other dielectric).

Signal lines may be formed in substrate 46. These lines, which may sometimes be referred to as interconnects, may be formed from metal-filled vias and other metal traces 48. Some of metal traces 48 may form contacts for panel 14P (see, e.g., inwardly facing display panel contacts 48C). Electrical components such as electrical component 50 of FIG. 5 may optionally be embedded in substrate 46. The interconnects formed from metal traces 48 may route signals between pixels P, components such as component 50 and/or other circuitry embedded in substrate 46, and/or contacts 48C. Components such as component 50 may include integrated circuits (e.g., a display integrated circuit such as a pixel control circuitry or other display integrated circuit that receives image data from the interconnects of interconnect substrate 44 and that routes this image data to a corresponding set of nearby pixels (e.g., an N×N array of pixels P). If desired, sensors 16 may be included in display panel 14P and/or substrate 44. For example, component 50 (or a set of components 50) may form one of sensors 16 such as a touch sensor, fingerprint sensor, force sensor, or other sensor and/or sensors 16 may be formed from thin-film circuitry in substrate 46 such as metal traces 48 and other thin-film structures in substrate 46 (e.g., thin-film transistors, etc.).

Contacts 48C of display panel 14P may mate with corresponding outwardly facing interconnect substrate contacts 52C in interconnect substrate 44. Interconnect substrate 44 may have one or more dielectric layers forming substrate material 54. These dielectric layer(s) may be formed from silicone, other elastomeric material, or other flexible polymer. Metal traces 52 may form signal paths (interconnects) in substrate 44 that convey signals between the contacts of substrate 44 and internal circuitry such as component 56. These interconnects may include contacts 52C and signal lines for routing power signals, data signals, and/or other signals to and/or from display panel 14P. As with optional component 50 of display panel 14P, interconnect substrate 44 may optionally include one or more embedded electrical components such as component 56 (e.g., an integrated circuit, sensors 16, etc.).

Inwardly facing interconnect substrate contacts such as contacts 52C on the lower (inwardly facing) surface of substrate 44 may receive external components such as external component 60. Components such as component 60 may include board-to-board connectors or other electrical connectors (e.g., to mate with a corresponding logic board connector) and/or may include integrated circuits (e.g., a display driver integrated circuit, sensors 16, etc.). As shown in FIG. 5, component 60 may include contacts 62 that mate with corresponding contacts 52C of substrate 44. Conductive material 58 may be used in helping to form electrical connections between connectors 48C and respective connectors 52C and between connectors 62 and corresponding connectors 52C. Conductive material 58 may include solder, anisotropic conductive adhesive, or other conductive material. If desired, electrical connections between mating contacts may be formed using other techniques such as thermocompression bonding or surface activated bonding.

Using an arrangement of the type shown in FIG. 5, image data may be supplied to substrate 44 from a display driver integrated circuit or other integrated circuit mounted to the lower surface of substrate 44 (e.g., component 60) and/or image data may be supplied to substrate 44 using a flexible printed circuit bus that is coupled to a connector on contacts 52C (e.g., in a configuration in which component 60 is a connector). The image data may then be routed to contacts 48C of display panel 14P via interconnects 52 and outwardly-facing contacts 52C. From contacts 48C, the image data may be routed to pixels P using interconnects 48 and optionally embedded circuitry such as component 50.

In illustrative configurations in which panel 14P has a tiled arrangement, each tile may have a respective optional embedded component 50 (e.g., a circuit that supplies an associated set of pixels P with image data). If desired, some of pixels P may be replaced by sensor electrodes (e.g., capacitive sensor electrodes for a capacitive touch sensor), light detectors such as photodiodes, and/or other sensors 16 (e.g. display 14 may be a touch sensitive display and/or may include other sensor circuitry such as fingerprint sensing circuitry, force sensors, etc.). Sensor data from sensors on the surface of panel 14P, from sensors embedded in panel 14P and/or sensors mounted on or embedded in substrate 44 may be routed through the interconnects of panel 14P and/or substrate 44 to control circuitry in device 10.

Figure 6:
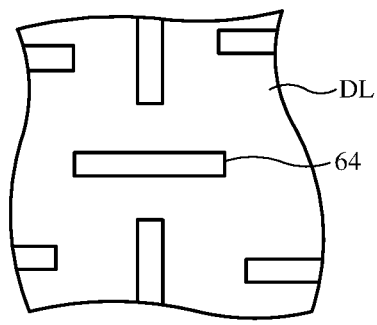
FIG. 6 is a top view of an illustrative display layer with slit-shaped (slot-shaped) openings in accordance with an embodiment.
Figure 7:
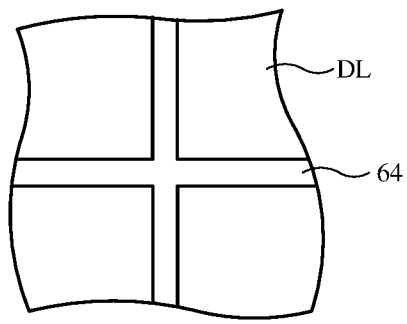
FIG. 7 is a top view of an illustrative display layer with grid-shaped openings in accordance with an embodiment.

To facilitate the ability of display 14 to conform to surfaces of compound curvature and other curved surfaces, one or more of the layers of display 14 may be provided with recesses and/or through-hole openings to enhance flexibility. Such openings may include slots such as illustrative slot-shaped openings 64 in display layer DL of FIG. 6, grid-shaped openings such as openings 64 in FIG. 7, and/or openings that create a mesh shape for display layer DL such as openings 64 of FIG. 8. Openings 64 may be configured (through selection of opening size, shape, layer penetration amount, density, and/or other attributes) to ensure that layer DL exhibits enhanced flexibility (e.g., the flexibility of layer DL with flexibility-enhancement openings 64 will be at least 10%, at least 50%, or other suitable amount greater than the flexibility of layer DL without any openings 64 and the ability of layer DL to exhibit an area of compound surface curvature will likewise been enhanced).

Figure 8:
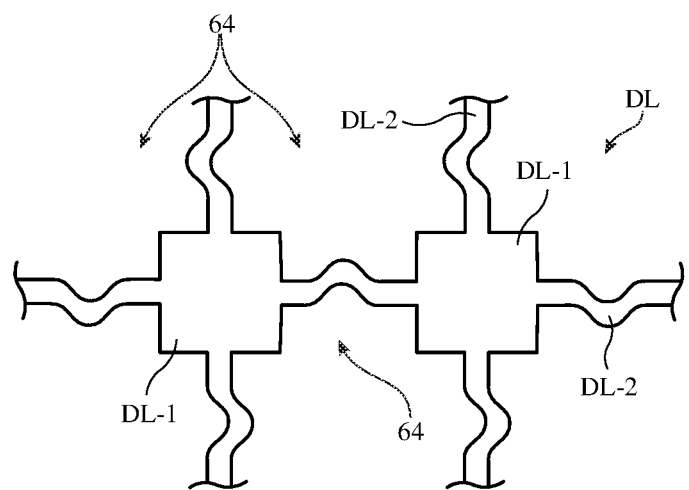
FIG. 8 is a top view of an illustrative mesh-shaped display layer having openings that form an array of islands interconnected to serpentine strips in accordance with an embodiment.

In the example of FIG. 8, the flexibly of display layer DL is enhanced by forming an array of openings 64 to create serpentine segments (display layer portions DL-2) that extend between an array of display layer islands (display layer portions DL-1). In display layer DL of FIG. 8, portions DL-2 are elongated strip-shaped structures with meandering paths and enhance flexibility. Interconnects (e.g., metal traces) can extend between portions DL-2 using intervening portions DL-1. The type of mesh shape, other mesh patterns that may be used for substrate 44, and/or other patterns of openings 64 in substrate 44 may provide substrate 44 with the ability to conform to surfaces with compound curvature and/or other surfaces with curved cross-sectional profiles without adversely affecting the density of visible pixels on the surface of display 14.

Figure 9:
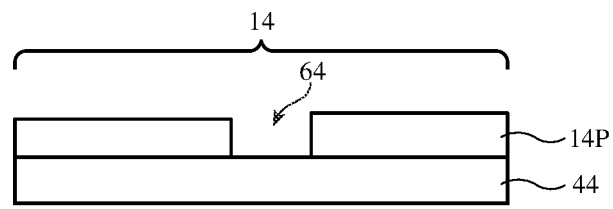
FIGS. 9, 10, 11, 12, and 13 are illustrative display layers in accordance with an embodiment.

FIG. 9 shows how opening 64 may extend entirely through a portion of display panel 14P (e.g., opening 64 may form a through-hole opening), whereas interconnect substrate 44 contains no openings. Opening 64 may form an array of openings 64 such as openings 64 of FIG. 8, may have slot shapes (slit shapes) such as openings 64 of FIG. 6, or may form a grid (see, e.g., opening 64 of FIG. 7) or create a mesh pattern (see, e.g., openings 64 of FIG. 8). If desired, openings 64 may have other shapes (e.g., circular shapes, triangular shapes, zig-zag shapes, hexagonal shapes, etc.).

Figure 10:
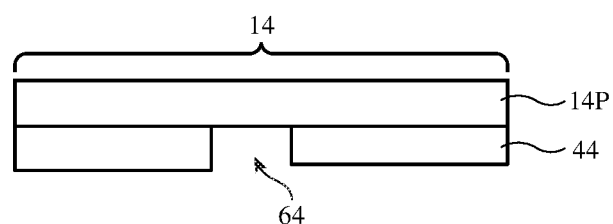

FIG. 10 shows how opening 64 may extend entirely through substrate 44 (e.g., so that substrate 44 has an array of slots, a grid-shaped opening, a mesh pattern with serpentine segments connecting islands, etc.). Display panel 14P in the FIG. 10 example does not have openings.

Figure 11:
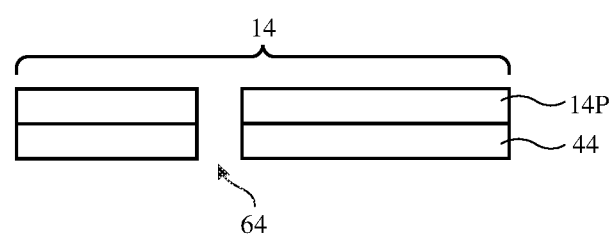

FIG. 11 shows how openings such as openings 64 may be formed in both substrate 44 and display panel 14P. When both substrate 44 and display panel 14P contain openings, the openings in substrate 44 and display panel 14P may be aligned with each other and/or may include openings that do not overlap.

Figure 12:
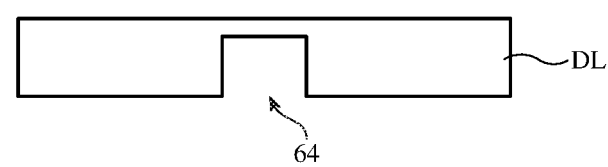

In the example of FIG. 12, opening 64 penetrates only partway through display panel DL (which may be a display panel, an interconnect substrate, an adhesive layer, a touch sensor layer, and/or other display layer). With this arrangement, opening 64 forms a recess rather than a through-hole opening. Recesses such as the recess of FIG. 12 may be formed in the upper and/or lower surfaces of display panel 14P and/or in the upper and/or lower surfaces of interconnect substrate 44 (as examples). Recesses and/or other openings in panel 14P may or may not be aligned with recesses and/or other openings in substrate 44.

Figure 13:
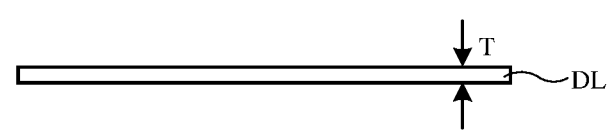

In some configurations, a display layer such as display layer DL of FIG. 13 may have a thickness T that is sufficiently thin to accommodate bending (e.g., to conform to a developable surface or a surface of compound curvature). The value of T may be less than 1 mm, less than 100 microns, less than 10 microns, less than 1 micron, less than 0.5 microns, at least 0.01 microns, or other suitable thickness.

Figure 14:
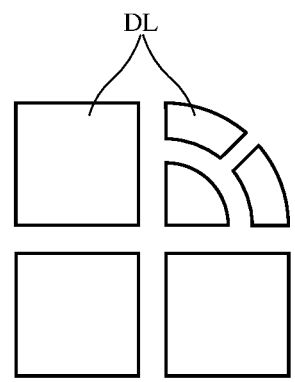
FIGS. 14 and 15 are top views of illustrative tiling patterns that may be used for display panels in accordance with embodiments.
Figure 15:
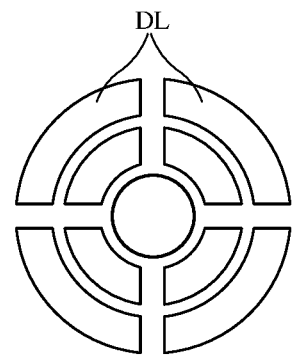

Regular and/or irregular tile patterns may be used for one or more display layers DL. In tiling arrangements, a through-hole grid-shaped opening (gap) is present between adjacent tiles, thereby allowing the tiles to be oriented independently (e.g., to conform to a display area with compound curvature, etc.). Tiles may be rectangular, square, triangular, hexagonal, circular, may have other shapes with straight and/or curved edges, etc. In the example of FIG. 14, a corner portion of display 14 is shown that contains a display layer DL that has been divided into tiles. The center portion of the display layer has an array of square display layer tiles (e.g., rows and columns of tiles). In the corner, tiles are formed with crescent shapes and/or other shapes with curved edges. FIG. 15 shows how a round display outline may be accommodated by using tiles that form circular ring segments surrounding a central circular tile. Other tile shapes may be used, if desired. Moreover, openings 64 of FIGS. 14 and/or 15 may, if desired, include recesses as well as or instead of through-holes. Display layer DL of FIGS. 14 and/or 14 may be a display panel such a display panel 14P, may be an interconnect substrate such as interconnect substrate 44, and/or may be any other suitable display layer structures for display 14 and may have curved surface areas.

Figure 16:
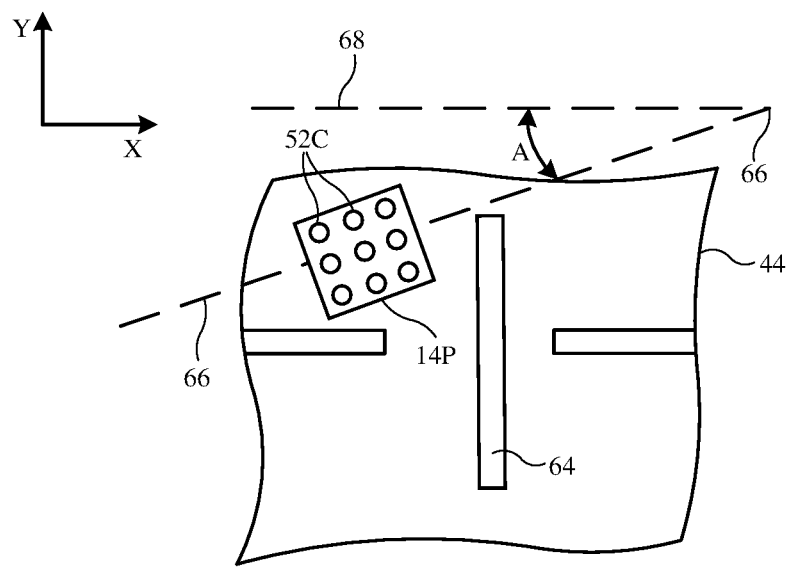
FIG. 16 is a top view of an illustrative flexible interconnect substrate with slots and an array of contacts oriented at a non-zero angle with respect to horizontal to compensate for expected rotation of the contacts when the flexible interconnect substrate is stretched into place in a display in accordance with an embodiment.

It may be desirable for the contacts that are formed on a display layer to be pre-rotated by an amount that will counteract expected rotational movement of the display layer when the display layer is stretched into place in display 14 (e.g., to form a display layer with a surface of compound curvature). Consider, as an example, substrate 44 of FIG. 16. As shown in FIG. 16, substrate 44 has contacts 52C. Contacts 52C may, as an example, be formed in an array having rows and columns. In anticipation of clockwise rotation of the portion of substrate 44 on which contacts 52C are formed, contacts 52C are initially routed counterclockwise so that contacts 52C are oriented at a non-zero angle A (e.g., an angle of 1-45° or other suitable angle) with respect to horizontal, as shown by the orientation of axis 66 (running parallel to the rows of contacts 52C) relative to horizontal axis 68 (which is parallel to the X axis of FIG. 16).

Figure 17:
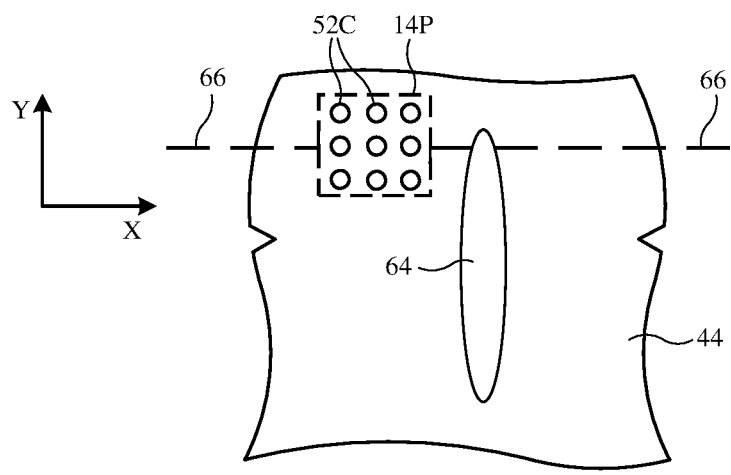
FIG. 17 is a top view of the illustrative flexible interconnect substrate of FIG. 16 following stretching in accordance with an embodiment.

FIG. 17 shows how openings 64 are stretched open (e.g., into a diamond-like shape) as substrate 44 is stretched into place (e.g., to conform to a desired shape with compound curvature or other curvature). Openings 64 provide substrate 44 with enhanced flexibility to accommodate desired curved shapes, but also tend to rotate contacts 52C when openings 64 deform in shape during stretching. By orienting contact 52C at a non-zero angle before stretching of substrate 44, proper horizontal alignment of display panel 14P and contacts 52C (e.g., an orientation where row axis 66 of the array of contacts 52C is oriented parallel to the X axis and where the edges of the display panel tile run horizontally and vertically or in other desired directions) is ensured. With this type of arrangement, contacts 52C on opposing sides of a given opening 64 may be pre-rotated in opposite directions. For example, a set of contacts 52C to the upper left of a vertical slot-shaped opening may be pre-rotated counterclockwise to counteract expected clockwise rotation when substrate 44 stretches the opening apart, whereas a corresponding set of contacts 52C to the upper right of a vertical slit-shaped opening may be pre-rotated clockwise to counteract expected counterclockwise rotation when substrate 44 stretches the opening apart.

If desired, different portions of a display layer (e.g., display panel 14P and/or substrate 44) may be provided with different elasticities. For example, rectangular areas or other areas of a display layer that includes contacts for mating with contacts in another display layer may be configured to be stiffer than surrounding areas. Display layer DL of FIG. 18 may, as an example, have portions such as portion 70 that are stiffer and therefore have a larger elastic modulus than surrounding portions of layer DL. Locally stiffened regions such as region 70 of FIG. 18 may overlap areas where arrays of contacts are formed (e.g., to help support the contacts and prevent movement of the positions of the contacts relative to each other which would impose undesired stress on the contacts).

Figure 19:
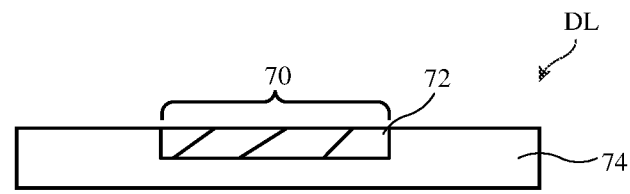

Local stiffening can be implemented by embedding stiffening members (e.g., stiffening plates) in display layer DL, by attaching stiffening members to display layer DL using adhesive, or using other stiffening arrangements. In the example of FIG. 19, region 70 includes a first material 72 that is stiffer than a second surrounding material 74. Material 74 may be, for example, a flexible elastomeric material such as flexible silicone and material 72 may be silicone or other material that has been treated to enhance stiffness. Material 72 may be formed by locally treating layer 74 and/or by using a two-shot process to embed material 72 in material

Figure 18:
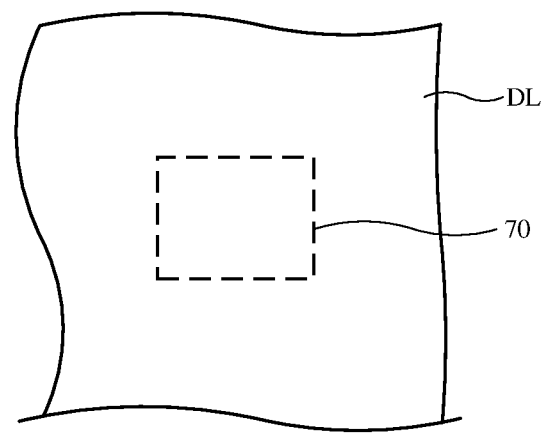
FIGS. 18, 19, and 20 are diagrams illustrating how a display layer may have areas of different rigidity in accordance with an embodiment.
Figure 20:
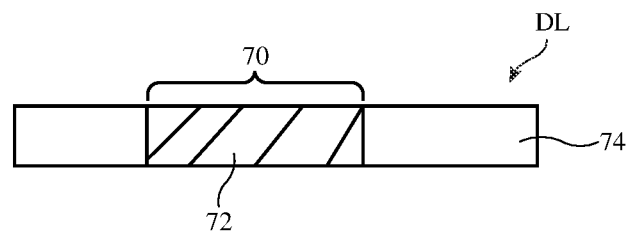

74. If desired, material 72 may pass entirely through the layer of material 74 in display layer DL (see, e.g., FIG. 20). When an arrangement of the type shown by layer DL of FIGS. 18, 19, and 20 is used to form substrate 44, interconnect substrate contacts may be restricted to regions 70 and may mate with corresponding display panel tile contacts on display panel tiles that each overlap a corresponding one of regions 70.

Figure 21:
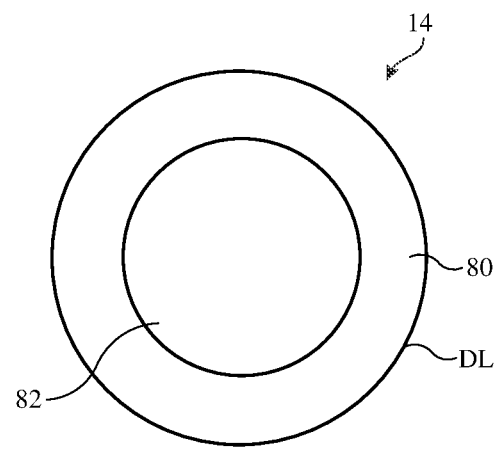
FIGS. 21 and 22 are top views of illustrative displays showing regions in which display layer flexibility may be selectively varied in accordance with an embodiment.
Figure 22:
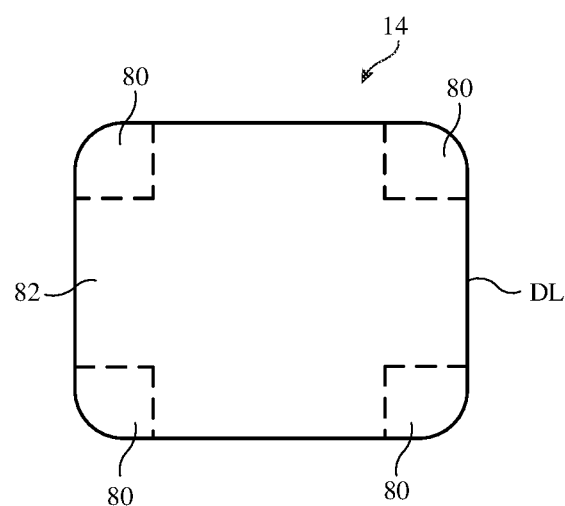

In addition to or instead of incorporating a display layer with locally stiffened regions to support contacts such as contacts 52C, display 14 may, if desired include one or more display layers DL that have different amounts of flexibility in different areas to accommodate different amounts of surface curvature. Consider, as an example, display 14 of FIG. 21. In this example, display 14 has a central region with a circular outline such as region 82 surrounded by a circular ring-shaped region 80. Display 14 may be planar or may have slightly domed shape in region 82. In region 80, display 14 may have significant compound curvature. The portions of display layers DL that overlap region 82 may be less flexible than the portions of display layers DL that overlap region 80. This allows display layers DL to bend and conform to the compound surface curvature of region 80. As an example, there may be a denser pattern of openings 64 in display layer DL in region 80 than in region 82, substrate material with a lower elastic modulus may be used in region 80 than in region 82, thinner material and/or larger openings 64 may be used in region 80 than in region 82, etc. This approach may be used regardless of the shape of display 14. For example, in a configuration of the type shown in FIG. 22 in which display 14 has a rectangular outline with rounded corners characterized by compound curvature, display layers DL may be configured to be more flexible in corner regions 80 than in center and edge regions 82.

Figure 23:
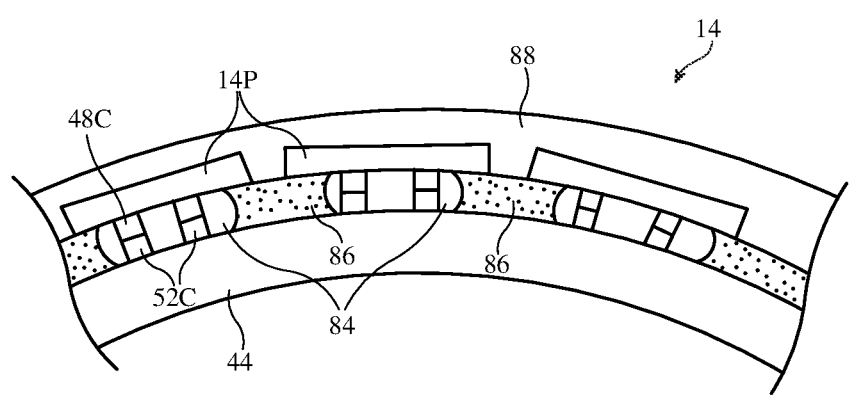
FIG. 23 is a cross-sectional side view of an illustrative display with rigid display panel tiles mounted on a flexible interconnect substrate in accordance with an embodiment.

In the illustrative configuration for display 14 that is shown in the cross-sectional side view of FIG. 23, display panel 14P has rigid display panel tiles that each contain an array of multiple pixels (e.g., an N×N array of pixels P). Display panel tiles may, for example, be formed from substrate material such as rigid printed circuit material (e.g., FR4) or other stiff polymer. This approach helps prevent tile flexing that might stress contact-to-contact joints. To cover a large area of display 14 including areas with curved surfaces (e.g., areas of compound curvature), display panel tiles may be arranged in a tiled array to form a display panel 14P that extends across the surface of display 14. Each display panel tile may have contacts that mate with corresponding contacts in flexible substrate layer 44. Rigid polymer adhesive 84 (e.g., underfill formed from rigid polymer with a first modulus) may be used to help attach display modules 14P to substrate 44. Flexible polymer adhesive 86 (e.g., polymer adhesive with a second modulus that is less than the first modulus) may be formed on the portions of the surface of substrate 44 that are not covered by rigid polymer adhesive 84. Because the polymer of adhesive 86 is flexible, substrate 44 is allowed to flex and conform to a desired curved surface shape. Substrate 44 may optionally be locally stiffened under each set of contacts 48C. Encapsulant layer 88 (e.g., clear polymer encapsulant and/or inorganic encapsulant layers) may, if desired, be formed over the surface of display 14 to help protect display 14 (e.g., to help protect the pixels in display panels 14P).

Figure 24:
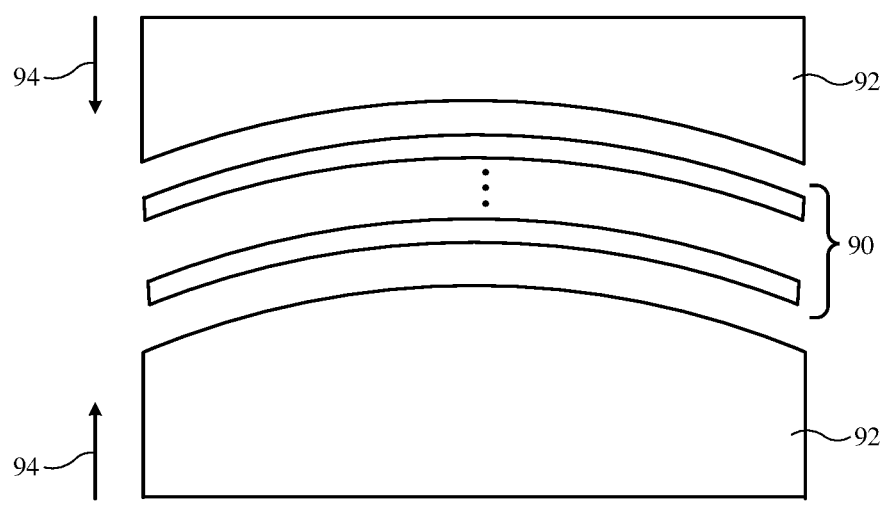
FIG. 24 is a side view of illustrative equipment for forming displays from layers having surface curvature in accordance with an embodiment.

Display 14 may be formed by laminating together layers of interest including display panel 14P, interconnect substrate 44, and/or additional layers such as additional polymer layers for adhesion and/or encapsulation, touch sensor layers and/or other layers that include sensor circuitry, support structures (e.g., a thermoplastic substrate or other polymer support structure for display 14 that has a convex surface for supporting the underside of substrate 44, display cover layers, etc.). As shown in FIG. 24, layers such as these (e.g., layers 90 of FIG. 24) may be bonded together under heat and/or pressure using dies 92 with planer and/or curved (convex and/or concave) opposing surfaces that are pressed together in directions 94.

Any suitable order of assembly may be used when attaching layers 90 together. For example, display panel(s) 14P may be bonded to substrate 44 (with or without interposed polymer layers such as layers of polymer serving as adhesive) before components (e.g., a display driver integrated circuit, a board-to-board connector, etc.) are mounted to the underside of substrate 44 or after these components have been mounted. All of layers 90 may be attached together at once using an assembly tool (e.g., using dies 92) or, if desired, layers 90 may be assembled in multiple steps. As an example, layers 90 forming display 14 such as display panel 14P and substrate 44 may be laminated together in a first step, followed by attachment of the assembled display panel and substrate 44 to the inner surface of cover layer 40 (FIG. 4) during a second step. Other assembly techniques may be used, if desired.

The foregoing is merely illustrative and various modifications can be made to the described embodiments. The foregoing embodiments may be implemented individually or in any combination.

What is claimed is:

1. An electronic device, comprising:
a housing; and
a display in the housing that is configured to display an image, wherein the display comprises:
a set of display panel tiles, each display panel tile in the set having an array of pixels arranged in columns and rows and having display panel contacts, wherein the set of display panel tiles is configured to display the image; and
a flexible interconnect substrate that includes an area of compound curvature, wherein the set of display panel tiles is mounted to the flexible interconnect substrate and overlaps the area of compound curvature, wherein the flexible interconnect substrate has interconnect substrate contacts that mate with the display panel contacts, wherein the flexible interconnect substrate includes first regions having a first elastic modulus and each overlapping a corresponding display panel tile in the set and includes second regions surrounding the first regions and having a second elastic modulus less than the first elastic modulus, and wherein the display panel contacts are joined to the interconnect substrate contacts in the first regions.

2. The electronic device defined in claim 1 wherein the flexible interconnect substrate comprises an array of flexibility-enhancement openings.

3. The electronic device defined in claim 2 wherein the flexibility-enhancement openings comprise through-hole openings.

4. The electronic device defined in claim 3 wherein the through-hole openings are arranged in an array to form a mesh pattern in the flexible interconnect substrate.

5. The electronic device defined in claim 3 wherein the flexibility-enhancement openings comprise slot-shaped openings.

6. The electronic device defined in claim 1 wherein the display panel tiles have polymer substrates formed from a polymer.

7. The electronic device defined in claim 1 wherein the flexible interconnect substrate comprises silicone.

8. The electronic device defined in claim 1 further comprising integrated circuits, wherein each integrated circuit is embedded in a respective one of the display panel tiles.

9. The electronic device defined in claim 1 further comprising an integrated circuit electrically coupled to metal traces in the flexible interconnect substrate.

10. The electronic device defined in claim 1 further comprising a board-to-board connector that is electrically coupled to metal traces in the flexible interconnect substrate.

11. The electronic device defined in claim 1 further comprising an encapsulant layer that covers the set of display panel tiles.

12. The electronic device defined in claim 1 wherein the display further comprises a transparent display cover layer that overlaps the set of display panel tiles.

13. The electronic device defined in claim 1 wherein the interconnect substrate contacts of the flexible interconnect substrate are oriented to compensate for rotation of the interconnect substrate contacts and corresponding rotation of the display panel tiles as the flexible interconnect substrate is stretched to conform to the area of compound curvature.

14. The electronic device defined in claim 1 further comprising:
   wireless transceiver circuitry; and
   a wrist strap coupled to the housing.

15. An electronic device, comprising:
   a housing; and
   a display coupled to the housing, wherein the display includes at least one display panel having an array of pixels configured to display an image and includes a separate flexible elastomeric interconnect substrate that is coupled to the display panel with adhesive, wherein the display panel has inwardly facing contacts that connect with corresponding outwardly facing contacts on the flexible elastomeric interconnect substrate using conductive material, wherein the adhesive surrounds the conductive material and comprises an elastomer configured to deform when portions of the display panel and the flexible elastomeric interconnect structure move relative to each other, and wherein the flexible elastomeric interconnect substrate comprises metal traces forming interconnects that are coupled to the outwardly facing contacts.

16. The electronic device defined in claim 15 wherein the flexible elastomeric interconnect substrate is stretched to form a surface with compound curvature that is overlapped by the display panel.

17. The electronic device defined in claim 16 further comprising:
   inwardly facing interconnect substrate contacts on an inwardly facing surface of the flexible elastomeric interconnect substrate; and
   a display driver integrated circuit coupled to the inwardly facing interconnect substrate contacts.

18. A display, comprising:
   display panel tiles each of which has pixels and an embedded integrated circuit that is electrically coupled to the pixels of that display panel tile; and
   a flexible interconnect substrate containing an array of slot-shaped openings and metal traces forming interconnects, wherein the flexible interconnect substrate has an area of compound curvature overlapped by at least some of the display panel tiles, wherein the flexible interconnect substrate is in a stretched state to conform to the area of compound curvature, wherein the display panel tiles each have display panel tile contacts that mate with corresponding flexible interconnect substrate contacts on the flexible interconnect substrate, wherein at least some of the flexible interconnect substrate contacts are configured to be in rotationally offset positions when the flexible interconnect substrate is in an un-stretched state, and wherein the flexible interconnect substrate contacts are configured to move from the rotationally offset positions to rotationally aligned positions in response to stretching of the array of slot-shaped openings when the flexible interconnect substrate is in the stretched state.

19. The display defined in claim 18 wherein the display panel tiles comprise rigid printed circuit board material and wherein the flexible interconnect substrate comprises a layer of elastomeric polymer with the array of slot-shaped openings.

20. The electronic device defined in claim 1, wherein the first and second regions each comprise polymer.

21. The electronic device defined in claim 20, wherein the polymer in the first regions has the first elastic modulus and the polymer in the second regions has the second elastic modulus.

* * * * *